(12) United States Patent
Kapusta et al.

(10) Patent No.: US 8,163,596 B2
(45) Date of Patent: Apr. 24, 2012

(54) STACKABLE ELECTRONIC PACKAGE AND METHOD OF MAKING SAME

(75) Inventors: Christopher James Kapusta, Delanson, NY (US); James Sabatini, Scotia, NY (US)

(73) Assignee: General Electric Company, Schenectady, NY (US)

( * ) Notice: Subject to any disclaimer, the term of this patent is extended or adjusted under 35 U.S.C. 154(b) by 315 days.

(21) Appl. No.: 12/410,281

(22) Filed: Mar. 24, 2009

(65) Prior Publication Data

US 2010/0244240 A1    Sep. 30, 2010

(51) Int. Cl.
*H01L 29/66* (2006.01)
(52) U.S. Cl. ........ 438/106; 438/107; 438/121; 438/126; 257/E21.705; 257/737
(58) Field of Classification Search .......... 257/737, 257/E23.07, E21.705; 438/106–107, 121, 438/126
See application file for complete search history.

(56) References Cited

U.S. PATENT DOCUMENTS

| | | | |
|---|---|---|---|
| 3,942,245 A | 3/1976 | Jackson et al. | |
| 4,783,695 A | 11/1988 | Eichelberger et al. | |
| 5,324,687 A | 6/1994 | Wojnarowski | |
| 5,373,627 A | 12/1994 | Grebe | |
| 5,973,393 A * | 10/1999 | Chia et al. | 257/690 |
| 6,255,137 B1 | 7/2001 | Gorczyca et al. | |
| 6,284,564 B1 | 9/2001 | Balch et al. | |
| 6,294,741 B1 | 9/2001 | Cole, Jr. et al. | |
| 6,602,739 B1 | 8/2003 | Rose et al. | |
| 6,847,109 B2 * | 1/2005 | Shim | 257/697 |
| 7,352,052 B2 * | 4/2008 | Imoto et al. | 257/622 |
| 7,361,533 B1 * | 4/2008 | Huemoeller et al. | 438/123 |
| 7,548,430 B1 * | 6/2009 | Huemoeller et al. | 361/760 |
| 7,777,351 B1 * | 8/2010 | Berry et al. | 257/778 |
| 7,791,206 B2 * | 9/2010 | Takeuchi et al. | 257/774 |
| 7,851,259 B2 * | 12/2010 | Kim | 438/108 |
| 2003/0006494 A1 * | 1/2003 | Lee et al. | 257/686 |

OTHER PUBLICATIONS

Forman et al., "Development of GE's Plastic Thin-Zero Outline Package (TZOP) Technology," IEEE Xplore, 1995, pp. 664-668.
Fillion et al., "Reliability Evaluation of Chip-on-Flex CSP Devices," 1998 international Conference on Multichip Modules and High Density Packaging, IEEE Xplore, 1998, pp. 242-246.
Package on Package (PoP) Family, Amkor Technology, http://www.amkor.com/go/packaging/all-packages/psvfbga/psvfbga-package-stackable-ver...
High Density Interconnect Technology, General Electric, Inc., Hanover, MD, 1999, http://www.mdatechnology.net/techprofile.aspx?id=439.

* cited by examiner

*Primary Examiner* — Tom Thomas
*Assistant Examiner* — Elias M Ullah
(74) *Attorney, Agent, or Firm* — Ziolkowski Patent Solutions Group, SC; Jean K. Teata

(57) ABSTRACT

An apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

17 Claims, 6 Drawing Sheets

STACKABLE ELECTRONIC PACKAGE AND METHOD OF MAKING SAME

GOVERNMENT RIGHTS IN THE INVENTION

This invention was made with Government support under grant number FA9453-04-C-003 awarded by the Air Force Research Laboratory. The Government has certain rights in the invention.

BACKGROUND OF THE INVENTION

The invention relates generally to integrated circuit packages and, more particularly, to an apparatus and method of fabricating a package having a reduced stacking height thereof.

Integrated circuit (IC) packages are typically fabricated having a number of embedded silicon devices such as memory chips, microprocessors, translation circuitry, buffering, switching, and the like. In order to combine and increase functionality of an IC, it is often desirable to stack and interconnect various die types into a single device or package. Thus, embedded chip packages can be manufactured having a plurality of chips or electronic components in a stacked 3D arrangement. The plurality of chips or electronic components are electrically connected to an input/output system by way of metal interconnects routed through a plurality of laminate re-distribution layers.

Advancements in IC packaging requirements pose challenges to the existing embedded chip build-up process. That is, it is desired in many current embedded chip packages to have an increased number of re-distribution layers, with eight or more re-distribution layers being common. The advancements are driven by ever-increasing needs for achieving better performance, greater miniaturization, and higher reliability. New packaging technology also has to further provide for the possibilities of batch production for the purpose of large-scale manufacturing thereby allowing economy of scale. Thus, as ICs become increasingly smaller and yield better operating performance, packaging technology has correspondingly evolved from leaded packaging, to laminate-based ball grid array (BGA) packaging, to chip-scale packaging (CSP), to flipchip packages, and to embedded chip build-up packaging.

There are a variety of known methods for stacking die to form a stacked package. One method includes stacking on the wafer level. In this approach, the dies are kept in wafer format and are stacked on top of each other and bonded together at high temperatures. Typically the layer-layer connections are formed by thru silicon vias. However, this method limits the mixing of die types that can be intermixed in the IC package. Another method is by stacking on the individual die level. Typically this method includes mounting a single die to a lead frame chip carrier interconnect platform and additional dies are then glued and stacked on top of each other. The interconnect is then formed by wirebonding to the exposed pads of the stacked die and to an I/O of the lead frame. However, this arrangement also limits the use of die types to those having perimeter connections and pyramid die stacking.

Furthermore, these stacking methods typically result in an unacceptably thick package height. In order to handle and process the die (in either wafer format or as individual die), each must be typically 250 microns or greater in thickness. Thus, when in final package form, an 8-layer structure, for example, may be 2 mm or more in thickness. Such a package may be cumbersome to work with, expensive to fabricate and process, and may be fragile to handle for subsequent processing and usage. Also, such limitations may limit the overall number of layers in the final package if there is a restrictive total package thickness for the final application, thus limiting the functionality and performance.

Additionally, a laser ablation process may be used to form cavities in the overmold/encapsulant of molded chip scale packages. However, control of the laser to ablate to a certain depth within the encapsulant is difficult, and damage to an underlying material may occur when performed on thinner materials. Also, side wall profiles of laser-drilled openings can be very irregular.

Accordingly there is a need for a method for embedded chip fabrication that allows for the application of multiple dies and die types in a stacked arrangement with a reduced overall stack height. There is a further need for embedded chip fabrication that allows for the application of multiple re-distribution layers and thinner package heights.

It would therefore be desirable to have a system and method capable of processing and fabricating a stacked IC package having a reduced package thickness.

BRIEF DESCRIPTION OF THE INVENTION

The invention provides a system and method of processing and fabricating a stacked IC package having a reduced package thickness.

In accordance with one aspect of the invention, an apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

In accordance with another aspect of the invention, a method comprises forming a first chip apparatus. Forming the first chip apparatus comprises coupling a first die and a first plurality of feed-thru pads to a first side of a first flex layer, the first die comprising a plurality of electrical pads; and coupling a first plurality of slugs to the first plurality of feed-thru pads. Forming the first chip apparatus also comprises encapsulating the first die, the first plurality of feed-thru pads, and the first plurality of slugs in a first encapsulant; and removing a portion of the first encapsulant to expose the first plurality of slugs. Forming the first chip apparatus further comprises removing the first plurality of slugs from the first encapsulant to form a first plurality of cavities in the first encapsulant, to expose a portion of the first plurality of feed-thru pads coupled to the first side of the first flex layer, and to reduce a rigidity of the first portion of the first plurality of feed-thru pads.

In accordance with yet another aspect of the invention, a method comprises forming a first chip package layer that comprises coupling a first die to a first flex layer, coupling a first plurality of feed-thru pads to the first flex layer, and coupling a first plurality of sacrificial material bodies to the first plurality of feed-thru pads. Forming the first chip package layer also comprises applying a first encapsulant to the first flex layer, to the first die, to the first plurality of feed-thru pads, and to the first plurality of sacrificial material bodies. Forming the first chip package layer further comprises curing the first encapsulant, grinding a portion of the encapsulant to reveal the first plurality of sacrificial material bodies, and expunging the first plurality of sacrificial material bodies from the encapsulant to create a plurality of chambers in the encapsulant and to reveal the first plurality of feed-thru pads.

BRIEF DESCRIPTION OF THE DRAWINGS

The drawings illustrate one preferred embodiment presently contemplated for carrying out the invention.

In the drawings.

DETAILED DESCRIPTION

Figure 1:
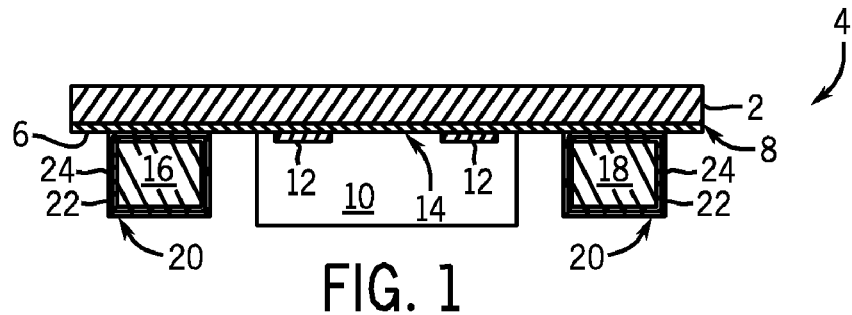
FIGS. 1-8 are schematic block diagrams showing steps of making a chip scale package incorporating in accordance with an embodiment of the invention.

FIGS. 1-8 are schematic block diagrams showing steps of making a stackable chip scale package having multiple chip scale package layers in accordance with an embodiment of the invention. FIG. 1 shows a flex material 2 of a first chip scale package layer 4 having a layer of adhesive 6 applied to a first side 8 thereof. In one embodiment, flex material 2 is formed of a dielectric material such as Kapton. A semiconductor die 10 having a plurality of contact pads 12 attached to an active surface 14 thereof is coupled or attached to first side 8 of flex material 2 via adhesive layer 6. In one embodiment, die 10 is placed into adhesive layer 6 using conventional pick and place equipment and methods. While FIG. 1 shows a die attached the flex material, in another embodiment of the invention, an electronic component 10 other than a die such as an active or passive electronic device may be attached to flex material 2. Additionally, it is contemplated that a plurality of electronic components 10 may be attached to flex material 2 such that a multi-component module or layer may be formed.

Still referring to FIG. 1, a pair of slugs or sacrificial materials 16, 18 are also coupled to first side 8 of flex material 2 via adhesive layer 6. Slugs 16, 18 are formed of a material allowing for the removal or dissolution of the slug 16, 18 via an etchant. In one embodiment, slugs 16, 18 are formed of a copper/molybdenum combination material that may be etched via ferric chloride. Slugs 16, 18 have a multi-layer coating 20 applied thereto comprising a layer of nickel 22 coating the slug material and a layer of gold 24 coating the layer of nickel 22. In one embodiment, the multi-layer coating 20 coats the entire slug 16, 18 as shown. However, the entire slug 16, 18 need not be coated. It is contemplated that at least the side of the slug 16, 18 facing the flex material 2 has the multi-layer coating 20 attached thereto. In one embodiment, slugs 16, 18 are placed into adhesive layer 6 using conventional pick and place equipment and methods.

Figure 2:
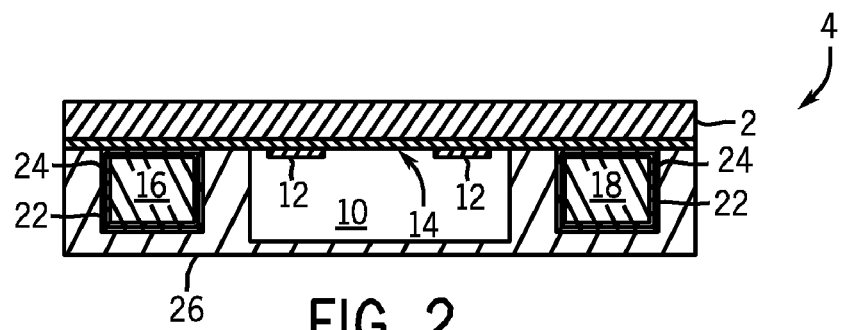
Figure 3:
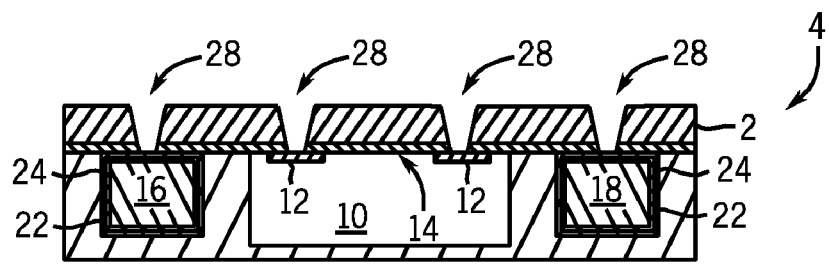

FIG. 2 shows a layer of encapsulant 26 applied to the first side 8 of flex material 2 and encapsulating die 10 and slugs 16, 18 according to an embodiment of the invention. In another embodiment, encapsulant 26 extends away from the first side 8 of flex material 2 but does not completely cover die 10 or slugs 16, 18. In one embodiment, encapsulant 26 is an epoxy. Encapsulant 26 is then allowed to cure. As shown in FIG. 3, once encapsulant 26 is cured, a plurality of vias 28 are formed through flex material 2 and adhesive 6 to expose contact pads 12 and the layer of gold 24. In one embodiment of the invention, vias 28 are formed via a laser forming process.

Figure 4:
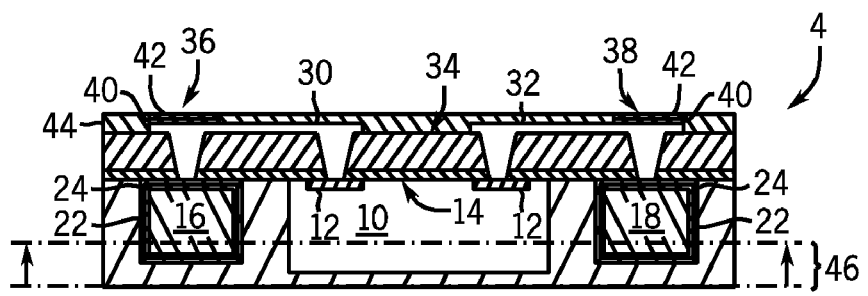

FIG. 4 shows a pair of metallization paths 30, 32 formed on a second side 34 of flex material 2 and extending through vias 28 to couple respective contact pads 12 to respective gold layers 24 of slugs 16, 18. Metallization paths 30, 32 may comprise, for example, a layer of copper coupled to a layer of titanium. A plurality of feed-thru pads 36, 38 comprising a layer of nickel 40 and a layer of gold 42 are formed or plated onto metallization paths 30, 32 using common PCB lithography processes. In one embodiment, a mask layer 44 is applied to the second side 34 of flex material 2 while leaving feed-thru pads 36, 38 exposed.

While not shown, it is contemplated that additional layers of dielectric or flex material with metallization paths may be formed for accommodating and/or re-distributing connections between contact pads 12, slugs 16, 18, and feed-thru pads 36, 38.

Figure 5:
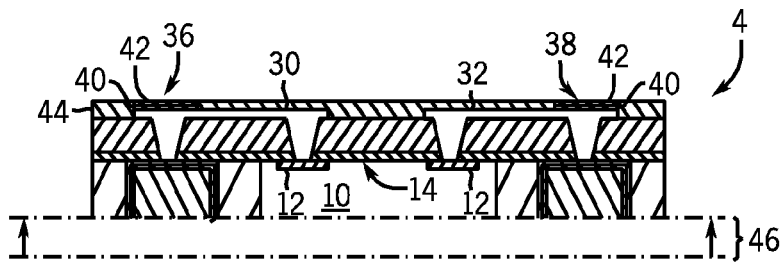
Figure 6:
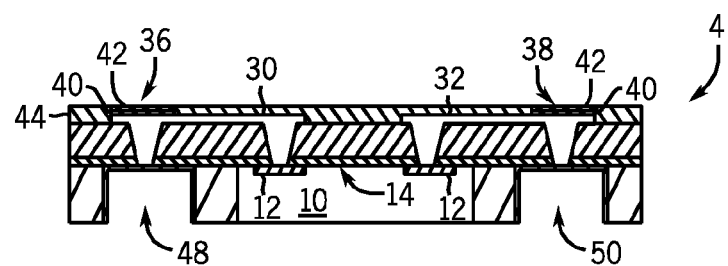

Referring to FIGS. 4 and 5, a portion 46 of first chip scale package layer 4 is removed via a grinding/lapping process to expose slugs 16, 18. The removed portion 46 includes portions of encapsulant 26, portions of the bulk material of die 10 if the bulk material is thicker than the desired package thickness, and a portion of slugs 16, 18 and multi-layer coating 20. As shown in FIG. 6, slugs 16, 18 and nickel layer 22 of multi-layer coating 20 are removed or expunged via an etchant (not shown) exposed thereto. Accordingly, a plurality of apertures or cavities 48, 50 are left formed in first chip scale package layer 4. The remaining layers of gold 24 in cavities 48, 50 form feed-thru pads coupled to feed-thru pads 36, 38 by metalized vias 28.

Figure 7:
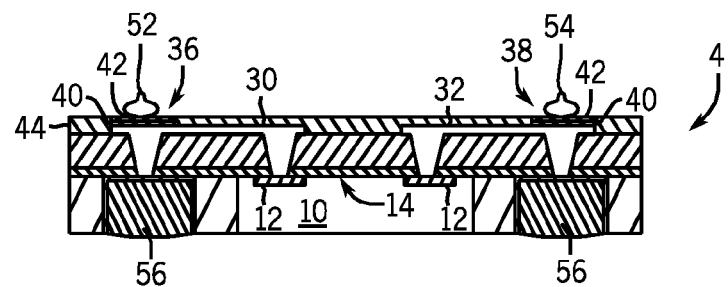

According to one embodiment as shown in FIG. 7, a plurality of stud bumps 52, 54 are affixed or coupled to feed-thru pads 36, 38, respectively, via ultrasonic welding, for example. Additionally, a solder material 56 is inserted into cavities 48, 50. Solder material 56 may be screened into cavities 48, 50 and may be a solder, a solder paste, or a conductive epoxy such as silver flakes suspended in epoxy filler.

Figure 8:
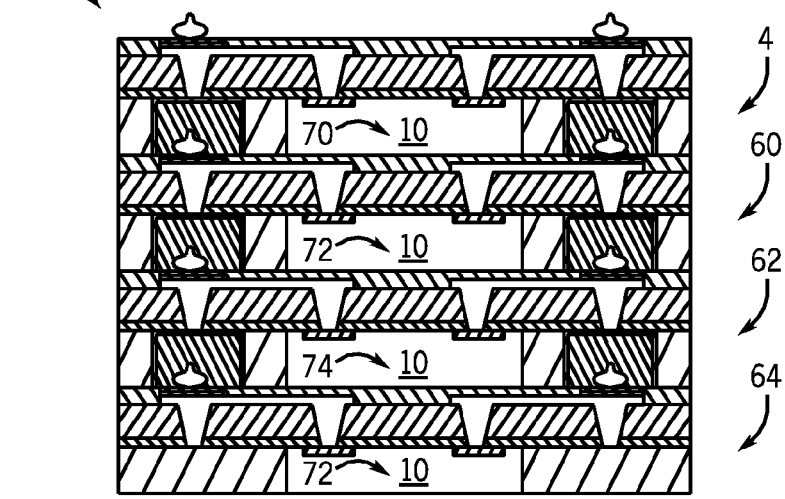
Figure 9:
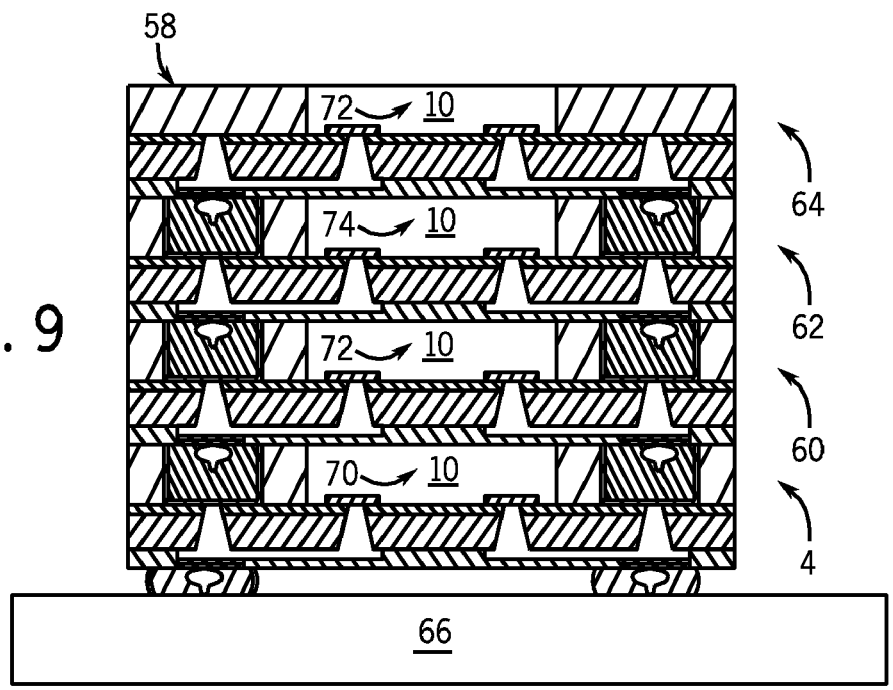
FIG. 9 is a schematic block diagram showing a multi-layer chip scale package in a first cross-sectional plane in accordance with an embodiment of the invention.

Referring to FIGS. 8 and 9, a multi-layer chip scale package 58 having second and third chip scale package layers 60, 62 formed via embodiments of the invention shown in FIGS. 1-7 is illustrated. A fourth chip scale package layer 64 is shown that does not have cavities formed in the encapsulant as described above. As shown in FIG. 9, fourth chip scale package layer 64 is a top layer of multi-layer chip scale package 58 when assembled to a component 66 such as a motherboard. Accordingly, it may not be desired to etch cavities thereinto as described above.

Chip scale package layers 4, 60, 62, and 64 are mounted or stacked one on top of the other, and the solder material 56 is reflowed and allowed to cure to couple layers 4, 60, 62, and 64 together. As shown, cavities 48, 50 allow stud bumps 52, 54 to be inserted thereinto such that an overall thickness of multi-layer chip scale package 58 is reduced.

According to an embodiment of the invention, dies 10 are all configured to perform identical tasks. For example, dies 10 may be of one die type configured to perform memory functions or processor functions. However, according to another embodiment of the invention, dies 10 are not all configured to perform identical tasks or to be of the same die type. For example, a first die type 70 may be configured to perform tasks of a first processor type, a second die type 72 may be configured to perform tasks of a second processor type, and a third die type 74 may be configured to perform tasks of a memory type as examples. Other die types are also contemplated herein.

Figure 10:
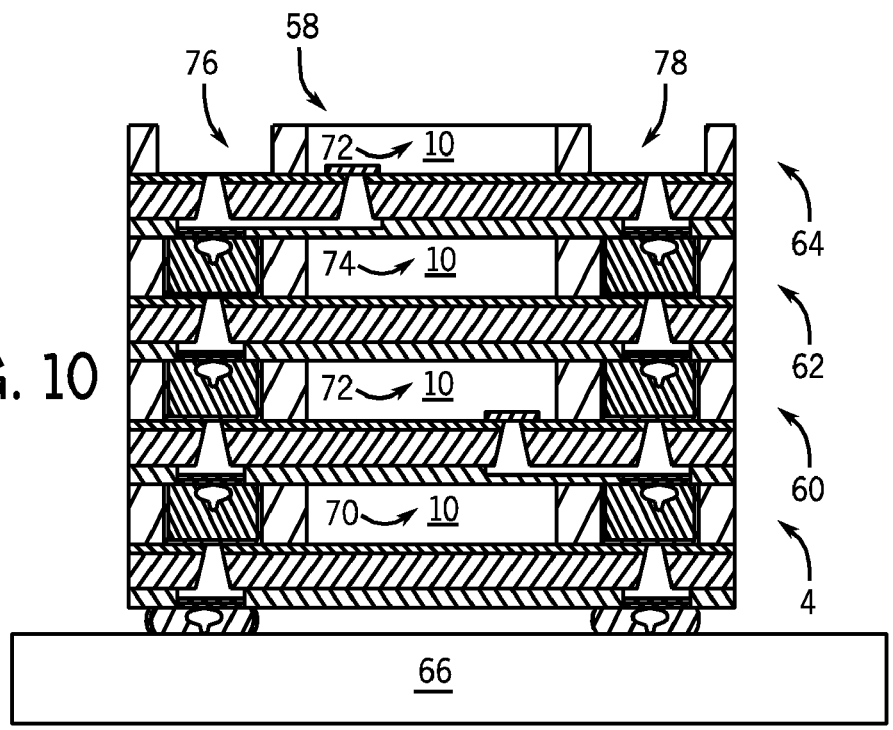
FIG. 10 is a schematic block diagram showing a multi-layer chip scale package in a second cross-sectional plane in accordance with an embodiment of the invention.

FIG. 9 illustrates a first cross-sectional plane of multi-layer chip scale package 58. As shown, feed-thru pads 36 of all layers 4, 60, 62, and 64 are coupled together, and feed-thru pads 38 of all layers 4, 60, 62, and 64 are coupled together. In this embodiment, electrical signals such as power and ground maybe respectively applied to feed-thru pads 36, 38 to provide power to dies 10. As shown in FIG. 10, a second cross-sectional plane of multi-layer chip scale package 58 allows a first electrical signal to be relayed to first die 70 of fourth chip scale package layer 64 and allows a second electrical signal to be relayed to second die 72 of second chip scale package layer 60. Additionally, while fourth chip scale package layer 64 of FIG. 9 is illustrated without having cavities formed thereinto, fourth chip scale package layer 64 of FIG. 10 has a pair of cavities 76, 78 formed thereinto according to embodiments of the invention to reduce a weight of multi-layer chip scale package 58. In another embodiment of the invention, cavities such as cavities 76, 78 may be formed in any of the chip scale package layers 4, 60, 62 to form keep-out areas or to accommodate or absorb surface-mounted components protruding from the adjoining surfaces of respective chip scale package layers 60, 62, and 64, thus reducing stacking height.

Figure 11:
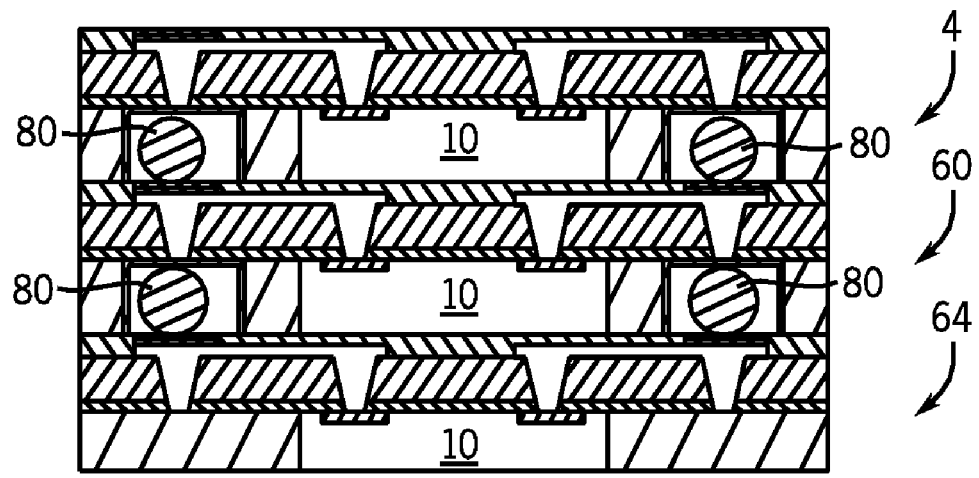
FIGS. 11-12 are schematic block diagrams showing steps of making a chip scale package incorporating in accordance with another embodiment of the invention.
Figure 12:
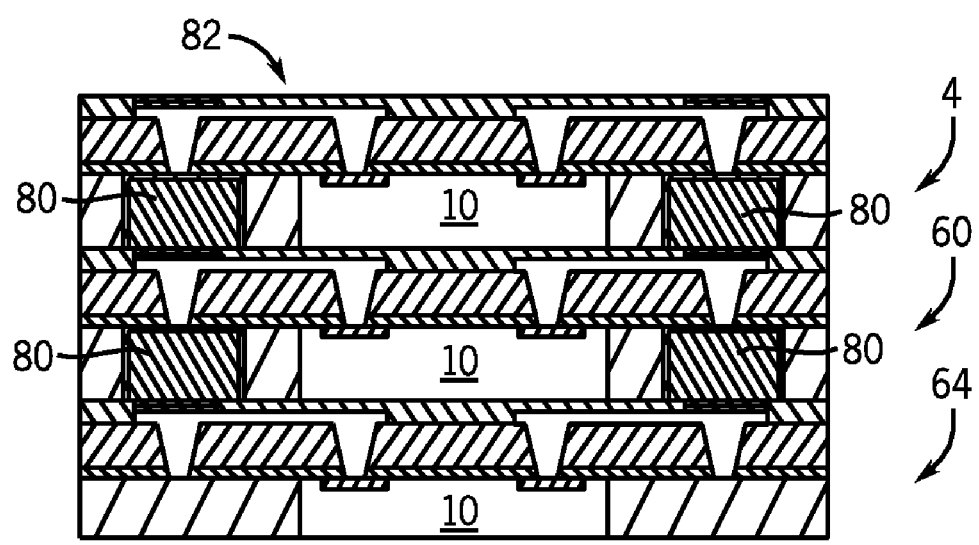

FIGS. 11 and 12 illustrates an alternative embodiment for joining chip scale package layers 4, 60, and 64 together. After forming chip scale package layers 4 and 60 as described above with respect to FIGS. 1-6, a ball of solder 80 may be placed in each of the cavities 48, 50 of layers 4, 60, and 64 as shown in FIG. 11. FIG. 12 shows a multi-layer chip scale package 82 of joined layers 4, 60, and 64 after reflowing and curing of the balls of solder 80.

Figure 13:
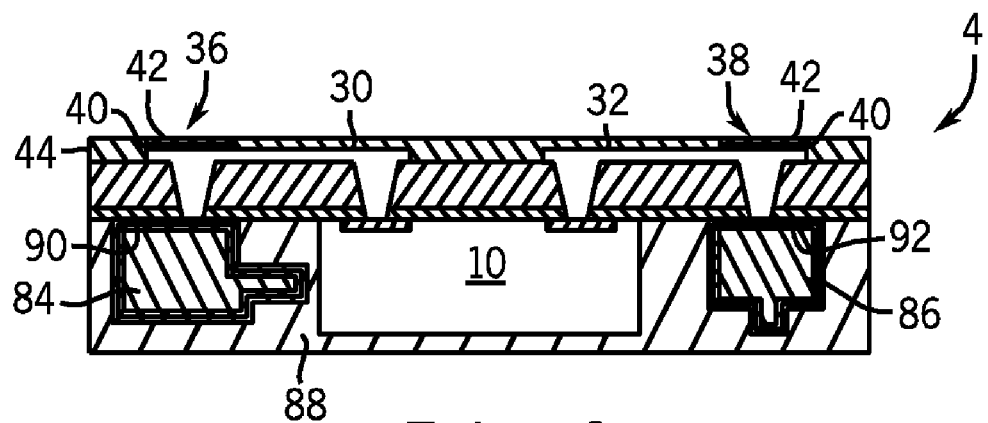
FIGS. 13-14 are schematic block diagrams showing alternately shaped slugs in accordance with another embodiment of the invention.
Figure 14:
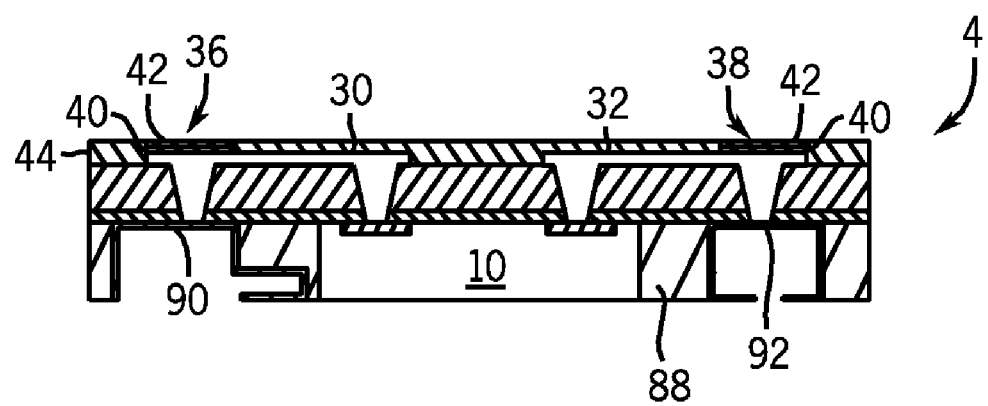

As shown in FIGS. 13 and 14, the shapes of the sacrificial slugs may vary according to the design of the cavity desired. As shown, a pair of sacrificial slugs 84, 86 having shapes different from each other are embedded into an encapsulant 88 according to an embodiment of the invention. When exposed to an etchant, sacrificial slugs 84, 86 leave behind respective gold layers 90, 92 shaped according to their respective sacrificial slugs 84, 86. In this manner, gold layers may be defined and shaped to function as electrical components such as antennas, horns, and radio frequency shields. In addition, the gold layers may be configured as a socket connector to receive a mating connector such as a pin or spring connector.

Figure 15:
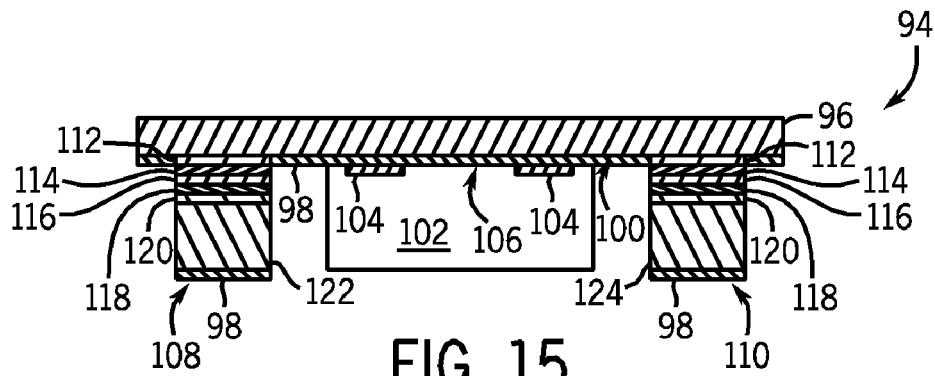
FIGS. 15-18 are schematic block diagrams showing steps of making a chip scale package incorporating in accordance with another embodiment of the invention.

FIGS. 15-18 are schematic block diagrams showing steps of making a chip scale package layer 94 in accordance with another embodiment of the invention. FIG. 15 shows a flex material 96 of chip scale package layer 94 having a plurality of multi-layer feed-thru pads 108, 110 are plated to a first side 100 of flex material 96. In one embodiment, flex material 96 is formed of a dielectric material such as Kapton. Each multi-layer feed-thru pad 108, 110 includes a titanium layer 112 deposited on the flex material 96, a copper layer 114 deposited on the titanium layer 112, a nickel layer 116 plated to the copper layer 114, a gold layer 118 plated to the nickel layer 116, and a nickel layer 120 plated to the gold layer 118. On the nickel layers 120, a slug 122, 124 is respectively plated. While FIG. 15 illustrates titanium layer 112 deposited on the flex material 96 in an embodiment of the invention, layer 112 may instead include chromium or other alloys in embodiments of the invention. In addition, while nickel, copper, and gold layers 114-120 are solderable surfaces known in the art, other commonly known solderable surfaces are also contemplated herein.

A layer of adhesive 98 is then applied to chip scale package layer 94. A die 102 having a plurality of contact pads 104 attached to an active surface 106 thereof is coupled or attached to first side 100 of flex material 96 via adhesive layer 98.

Figure 16:
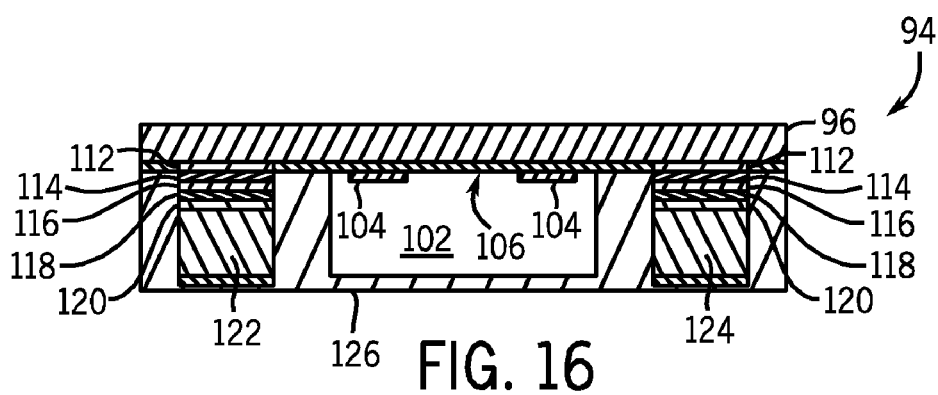
Figure 17:
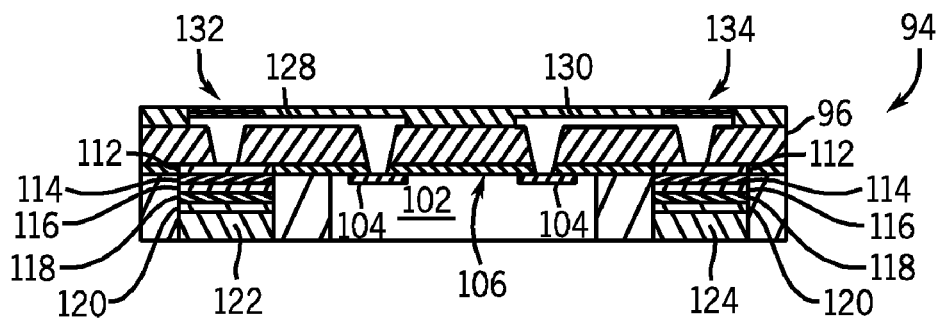
Figure 18:
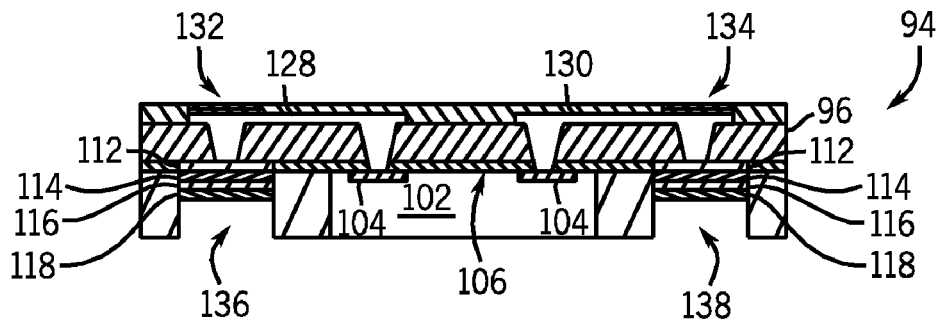

FIG. 16 shows a layer of encapsulant 126 applied to flex material 96, die 102, multi-layer feed-thru pads 108, 110, and slugs 122, 124. After the encapsulant layer 126 is cured, FIG. 17 illustrates that chip scale package layer 94 is prepared similar to that described above in FIGS. 3-5 to form metallization layers 128, 130, feed-thru pads 132, 134, and to expose slugs 122, 124. As shown in FIG. 18, exposed slugs 122, 124 and nickel layers 120 are removed or etched away, leaving gold layers 118 of multi-layer feed-thru pads 108, 110 exposed in cavities 136, 138 for coupling chip scale package layer 94 to other chip scale packages similarly formed or formed as described above in FIGS. 1-7. The remaining portions of multi-layer feed-thru pads 108, 110 form "floating" pads that are configured to flex to reduce stress on solder joints coupled thereto.

A multi-layer chip scale package according to an embodiment of the invention allows a reduction of stacked package height by allowing the cavities formed in the layers to absorb the height of the solder ball or gold bond. Furthermore, cavities may be formed according to embodiments of the invention to reduce an overall weight of the multi-layered chip scale package or to allow components of an adjacent layer to be inserted into the cavities. The formed cavities tend to have smooth and regular walls when formed according to embodiments of the invention. In addition, when solder balls are placed on opposite sides of the cavities, the substrate of the chip scale package layers acts as a "drum-head" or "floating pad" and reduces the stress of the solder joint.

In accordance with one embodiment of the invention, an apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

In accordance with another embodiment of the invention, a method comprises forming a first chip apparatus. Forming the first chip apparatus comprises coupling a first die and a first plurality of feed-thru pads to a first side of a first flex layer, the first die comprising a plurality of electrical pads; and coupling a first plurality of slugs to the first plurality of feed-thru pads. Forming the first chip apparatus also comprises encapsulating the first die, the first plurality of feed-thru pads, and the first plurality of slugs in a first encapsulant; and removing a portion of the first encapsulant to expose the first plurality of slugs. Forming the first chip apparatus further comprises removing the first plurality of slugs from the first encapsulant to form a first plurality of cavities in the first encapsulant, to expose a portion of the first plurality of feed-thru pads coupled to the first side of the first flex layer, and to reduce a rigidity of the first portion of the first plurality of feed-thru pads.

In accordance with yet another embodiment of the invention, a method comprises forming a first chip package layer that comprises coupling a first die to a first flex layer, coupling a first plurality of feed-thru pads to the first flex layer, and coupling a first plurality of sacrificial material bodies to the first plurality of feed-thru pads. Forming the first chip package layer also comprises applying a first encapsulant to the first flex layer, to the first die, to the first plurality of feed-thru pads, and to the first plurality of sacrificial material bodies. Forming the first chip package layer further comprises curing the first encapsulant, grinding a portion of the encapsulant to reveal the first plurality of sacrificial material bodies, and expunging the first plurality of sacrificial material bodies from the encapsulant to create a plurality of chambers in the encapsulant and to reveal the first plurality of feed-thru pads.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
    forming a first chip apparatus comprising:
        coupling a first die and a first plurality of feed-thru pads to a first side of a first flex layer, the first die comprising a plurality of electrical pads;
        coupling a first plurality of slugs to the first plurality of feed-thru pads;
        encapsulating the first die, the first plurality of feed-thru pads, and the first plurality of slugs in a first encapsulant;
        removing a portion of the first encapsulant to expose the first plurality of slugs; and
        removing the first plurality of slugs from the first encapsulant to form a first plurality of cavities in the first encapsulant, to expose a portion of the first plurality of feed-thru pads coupled to the first side of the first flex layer, and to reduce a rigidity of the first portion of the first plurality of feed-thru pads.

2. The method of claim 1 wherein forming the first chip apparatus further comprises:
    forming a first plurality of vias through the first flex layer to expose the plurality of electrical pads on the first die;
    forming a first plurality of metalized paths on a second side of the first flex layer;
    coupling the first plurality of metalized paths to the exposed plurality of electrical pads on the first die by way of the first plurality of vias;
    forming a second plurality of vias through the first flex layer to expose the first plurality of feed-thru pads;
    forming a second plurality of metalized paths on the second side of the first flex layer; and
    coupling the second plurality of metalized paths to the exposed first plurality of feed-thru pads by way of the second plurality of vias.

3. The method of claim 2 wherein forming the first chip apparatus further comprises coupling a second plurality of feed-thru pads to the second plurality of metalized paths.

4. The method of claim 3 further comprising:
    forming a second chip apparatus comprising:
        coupling a second die to a first side of a second flex layer, the second die comprising a plurality of electrical pads; and
        encapsulating the second die a second encapsulant;
        forming a third plurality of vias through the second flex layer to expose the plurality of electrical pads on the second die;
        forming a third plurality of metalized paths on a second side of the second flex layer;
        coupling the third plurality of metalized paths to the exposed plurality of electrical pads on the second die by way of the third plurality of vias;
        coupling a third plurality of feed-thru pads to the third plurality of metalized paths; and
    coupling the third plurality of feed-thru pads to the first plurality of feed-thru pads.

5. The method of claim 4 wherein coupling the third plurality of feed-thru pads to the first plurality of feed-thru pads comprises:
    inserting a solder material into each of the first plurality of cavities;
    putting the third plurality of feed-thru pads into contact with the solder material; and
    soldering the first and third plurality of feed-thru pads together via the solder material.

6. The method of claim 5 wherein coupling the third plurality of feed-thru pads to the first plurality of feed-thru pads further comprises:
    coupling a stud bump to each of the third plurality of feed-thru pads; and
    inserting the stud bumps into the solder material and into the first plurality of cavities.

7. The method of claim 1 wherein coupling the first plurality of slugs to the first plurality of feed-thru pads comprises attaching an electrically conductive coating to each of the first plurality of slugs prior to coupling the first plurality of feed-thru pads to the first side of the first flex layer.

8. The method of claim 7 wherein attaching the electrically conductive coating comprises:
    attaching a layer of nickel to each slug comprising copper; and
    attaching a layer of gold to each layer of nickel.

9. The method of claim 1 wherein coupling the first plurality of feed-thru pads comprises coupling a plurality of multi-layer feed-thru pads to the first side of the first flex layer.

10. The method of claim 9 wherein coupling each of the plurality of multi-layer feed-thru pads comprises:
    depositing a layer of titanium on the first side of the first flex layer;
    depositing a layer of copper on the layer of titanium;
    plating a first layer of nickel on the layer of copper;
    plating a layer of gold on the first layer of nickel; and
    plating a second layer of nickel on the layer of gold.

11. The method of claim 10 wherein coupling the first plurality of slugs to the first plurality of feed-thru pads comprises electrically coupling each slug of the first plurality of slugs to a respective second layer of nickel of the first plurality of feed-thru pads.

12. A method comprising:
    forming a first chip package layer comprising:
        coupling a first die to a first flex layer;
        coupling a first plurality of feed-thru pads to the first flex layer;
        coupling a first plurality of sacrificial material bodies to the first plurality of feed-thru pads;
        applying a first encapsulant to the first flex layer, to the first die, to the first plurality of feed-thru pads, and to the first plurality of sacrificial material bodies;
        curing the first encapsulant;
        grinding a portion of the encapsulant to reveal the first plurality of sacrificial material bodies; and expunging the first plurality of sacrificial material bodies from the encapsulant to create a plurality of chambers in the encapsulant and to reveal the first plurality of feed-thru pads.

13. The method of claim 12 further comprising:
forming a second chip package layer comprising:
   coupling a second die to a second flex layer;
   applying a second encapsulant to the second flex layer and to the second die;
   curing the second encapsulant;
   coupling a second plurality of feed-thru pads to the second flex layer; and
   metalizing the second flex layer to couple a plurality of pads on the second die to the second plurality of feed-thru pads;
wherein forming the first chip package layer further comprises:
   coupling a third plurality of feed-thru pads to the first flex layer; and
   metalizing the first flex layer to couple a plurality of pads on the first die to the first and third plurality of feed-thru pads;
inserting a solder material into the plurality of chambers; and
coupling the first and second pluralities of feed-thru pads together by way of the solder material.

14. The method of claim 12 wherein coupling the first die to the first flex layer comprises coupling the first die having a first die configuration to the first flex layer; wherein coupling the second die to the second flex layer comprises coupling the second die having a second die configuration to the second flex layer; and wherein the first and second die configurations are distinct from one another.

15. The method of claim 12 further comprising:
forming a sacrificial slug;
coating at least a portion of the sacrificial slug with an electrically conductive material;
encapsulating the coated sacrificial slug in the first encapsulant; and
expunging the sacrificial slug from the first encapsulant such that the electrically conductive material forms an electrical component.

16. The method of claim 15 wherein the electrical component comprises one of an antenna, a horn, a socket connector, and a radio frequency shield.

17. The method of claim 16 further comprising:
forming a sacrificial slug;
encapsulating the coated sacrificial slug in the first encapsulant; and
expunging the sacrificial slug from the first encapsulant such that a weight of the first chip apparatus is reduced.

* * * * *